United States Patent
Baek et al.

(10) Patent No.: US 10,931,151 B2
(45) Date of Patent: Feb. 23, 2021

(54) COMBINATION ANTENNA MODULE AND PORTABLE ELECTRONIC DEVICE INCLUDING SAME

(71) Applicant: Amotech Co., Ltd., Incheon (KR)

(72) Inventors: Hyung-Il Baek, Yongin-si (KR); Jin Won Noh, Gwangju (KR); Jae-Il Park, Yeoju-si (KR)

(73) Assignee: Amotech Co., Ltd., Incheon (KR)

( * ) Notice: Subject to any disclaimer, the term of this patent is extended or adjusted under 35 U.S.C. 154(b) by 332 days.

(21) Appl. No.: 15/745,731

(22) PCT Filed: Jul. 11, 2016

(86) PCT No.: PCT/KR2016/007495
§ 371 (c)(1),
(2) Date: Jan. 18, 2018

(87) PCT Pub. No.: WO2017/014467
PCT Pub. Date: Jan. 26, 2017

(65) Prior Publication Data
US 2018/0219427 A1    Aug. 2, 2018

(30) Foreign Application Priority Data

Jul. 20, 2015 (KR) .................. 10-2015-0102441
Jul. 20, 2015 (KR) .................. 10-2015-0102443

(51) Int. Cl.
*H02J 50/40* (2016.01)
*H02J 50/10* (2016.01)
(Continued)

(52) U.S. Cl.
CPC .......... *H02J 50/40* (2016.02); *H01F 27/2804* (2013.01); *H01F 38/14* (2013.01);
(Continued)

(58) Field of Classification Search
CPC .. H02J 50/40; H02J 7/025; H02J 50/12; H02J 50/10; H01F 27/2804; H01F 38/14;
(Continued)

(56) References Cited

U.S. PATENT DOCUMENTS 9,413,191 B2  8/2016 Kim et al.
2010/0081483 A1* 4/2010 Chatterjee ........... H01F 1/15333
                                                        455/572
(Continued)

FOREIGN PATENT DOCUMENTS

KR   10-2013-0015618   2/2013
KR   10-1265234        5/2013
(Continued)

OTHER PUBLICATIONS

International Search Report of the ISA/KR dated Nov. 10, 2016; for PCT/KR2016/007495; 4 pages.

*Primary Examiner* — Daniel J Cavallari
*Assistant Examiner* — Thai H Tran
(74) *Attorney, Agent, or Firm* — Daly Crowley Mofford & Durkee, LLP

(57) ABSTRACT

Provided are a combination antenna module and a portable electronic device including the same. There is provided a combo antenna module that includes an antenna unit including and a switching unit. The antenna unit includes a circuit board, a first wireless power transmission antenna, and a second wireless power transmission antenna of which manner is different from that of the first wireless power transmission antenna. The switching unit includes a first capacitor and a second capacitor connected in parallel to the second wireless power transmission antenna, and a switch, disposed between the first capacitor and the second capacitor, to be opened or closed based on an operation mode of the antenna unit. The second antenna and the second capaci- (Continued)

tor form a closed loop which is coupled with the first antenna when the switch is opened.

12 Claims, 9 Drawing Sheets

(51) Int. Cl.
| | |
|---|---|
| *H02J 50/12* | (2016.01) |
| *H04B 5/00* | (2006.01) |
| *H01Q 1/22* | (2006.01) |
| *H01Q 7/00* | (2006.01) |
| *H05K 1/18* | (2006.01) |
| *H01F 38/14* | (2006.01) |
| *H01F 27/28* | (2006.01) |
| *H01Q 1/52* | (2006.01) |
| *H02J 7/02* | (2016.01) |
| *H01F 27/36* | (2006.01) |

(52) U.S. Cl.
CPC ............. *H01Q 1/22* (2013.01); *H01Q 1/526* (2013.01); *H01Q 7/00* (2013.01); *H02J 7/025* (2013.01); *H02J 50/10* (2016.02); *H02J 50/12* (2016.02); *H04B 5/0037* (2013.01); *H05K 1/189* (2013.01); *H01F 27/36* (2013.01)

(58) Field of Classification Search
CPC .... H01F 27/365; H05K 1/189; H04B 5/0037; H01Q 1/526; H01Q 7/00; H01Q 1/22
USPC .......................................... 307/104; 320/108
See application file for complete search history.

(56) References Cited

U.S. PATENT DOCUMENTS

| | | | | |
|---|---|---|---|---|
| 2013/0308256 | A1* | 11/2013 | Lehr | ................ H01F 5/003 361/679.01 |
| 2014/0184151 | A1* | 7/2014 | Han | .................. H01F 5/04 320/108 |
| 2015/0171519 | A1* | 6/2015 | Han | .................. H01Q 7/00 343/720 |
| 2015/0207207 | A1* | 7/2015 | Park | .................. H01Q 7/00 343/702 |
| 2015/0249360 | A1* | 9/2015 | Ichikawa | ............ H04B 5/0037 320/108 |
| 2016/0254705 | A1* | 9/2016 | Jung | ................. H02J 50/40 307/104 |

FOREIGN PATENT DOCUMENTS

| | | |
|---|---|---|
| KR | 10-2013-0088858 | 8/2013 |
| KR | 10-2015-0028042 | 3/2015 |
| KR | 10-2015-0048761 | 5/2015 |

* cited by examiner

COMBINATION ANTENNA MODULE AND PORTABLE ELECTRONIC DEVICE INCLUDING SAME

CROSS-REFERENCE TO RELATED APPLICATION

This application is a U.S. National Stage of PCT/KR2016/007495 filed in the Korean language on Jul. 11, 2016, entitled: "Combination Antenna Module And Portable Electronic Device Including Same" which application claims priority to Korean Application No. 10-2015-0102441 filed on Jul. 20, 2015 and to Korean Application No. 10-2015-0102443 filed on Jul. 20, 2015, which applications are each hereby incorporated herein by reference in their entireties.

BACKGROUND

1. Technical Field

The present disclosure relates to an antenna module, and more particularly, to a combo antenna module and a portable electronic device including the same, which can expand a range of wireless power transmission or wireless communication, and improve efficiency and performance of the wireless power transmission or wireless communication according to an operation mode.

2. Discussion of the Related Art

Recently, portable electronic devices including mobile phones, tablet PCs, and the like are equipped with various wireless communication functions and a wireless charging function using wireless power transmission. Here, since each wireless communication and wireless power transmission uses different frequency depending on each application, it is necessary to provide an antenna for each frequency or application. Therefore, the number of antennas to be provided in portable electronic devices increase.

As the kind of usable antennas, such as a near field communication (NFC) antenna and a magnetic secure transmission (MST) antenna for the wireless communication, or a wireless power consortium (WPC) antenna, a power matters alliance (PMA) antenna and an alliance for wireless power (A4WP) antenna for the wireless power transmission, is increased, it appears that the antennas are applied in a combo form.

The WPC and PMA antennas perform the wireless power transmission in a magnetic induction manner inducing a current from one coil to another coil via a magnetic field, while the A4WPC antenna performs the wireless power transmission in a magnetic resonance manner transmitting energy by coupling coils having the same resonance frequency with each other.

The magnetic induction manner is so sensitive to a distance between the coils and relative positions that the transmission efficiency may drop sharply. On the other hand, in the magnetic resonance manner, it is possible to wirelessly transmit power even though the distance between the coils is not close to each other. However, there are problems that the transmission efficiency may be low due to large power loss, and electromagnetic waves may be generated over a wide range.

Therefore, recent portable electronic devices are adopting both the magnetic induction manner and the magnetic resonance manner so as to supplement disadvantages for the wireless power transmission function and selectively use them as needed.

Meanwhile, an inductance of a loop antenna may be determined relying on a communication frequency and a wireless power transmission frequency of each application.

For example, in the case of the NFC antenna, an inductance of 1 to 2 μH is required to implement a frequency of 13.56 MHz, in case of the A4WP antenna, an inductance of 1 to 2 μH is required to implement a frequency of 6.78 MHz, in case of the WPC or the PMA antenna, an inductance of 6 to 12 μH is required to implement a frequency of 100 to 350 kHz, and in case of the MST antenna, an inductance of 10 to 40 μH is required to implement a frequency of 100 kHz or less.

That is, the NFC antenna or the A4WP antenna for wireless power transmission of the magnetic resonance manner requires a relatively low inductance because the used frequency is higher than that of the MST antenna, or the WPC and PMA antenna for wireless power transmission of the magnetic induction manner.

Therefore, generally the wireless power transmission (WPC, or PMA) antenna of the magnetic induction manner is disposed at the center portion of the antenna unit considering the wireless power charging range between a wireless power transmitter (Tx) and a wireless power receiver (Rx) and a strength and efficiency of wireless power transmission. In particular, in a combo antenna, the WPC or the PMA antenna is generally disposed at the center portion of the antenna unit, and the MST antenna is disposed at the outer periphery of antenna unit.

The NFC or A4WP antenna having a relatively low inductance is disposed at the outer periphery of the combo antenna because the performance is better as the antenna area is larger. Therefore, as for NFC or A4WP antenna, an additional pattern in the inner area of the antenna unit is provided to expand the range of the wireless power transmission or wireless power communication, and to improve the efficiency and performance of the wireless power transmission or the wireless communication.

However, since the combo antenna having a plurality of antennas is provided with the antenna such as the WPC, PMA, or MST antenna at the center of the antenna unit, it is not easy to implement an additional pattern of the NFC or A4WP antenna.

Therefore, there is a need to develop a technique capable of increasing the area of the NFC or A4WP antenna without affecting the antennas such as the WPC, PMA or MST disposed in the antenna unit.

SUMMARY

To solve the above problem and defects, it is an object of the present disclosure to provide a combo antenna module capable of improving a range, efficiency and performance of a wireless power transmission or wireless communication, by using an antenna of another mode by switching according to an operation mode of an antenna unit.

In addition, it is another object of the present disclosure to provide a portable electronic device having a wireless power transmission function capable of improving the range, efficiency and performance of the wireless power transmission or wireless communication, by using a combo antenna module including two antennas which can be switched according to the operation mode of the antenna unit.

To accomplish the above and objects of the present disclosure, there is provided a combo antenna module that includes an antenna unit and a switching unit. The antenna unit includes a circuit board, a first antenna for wireless power transmission, and a second antenna for wireless power transmission of which manner is different from that of the first antenna. The switching unit includes a first capacitor and a second capacitor connected in parallel to the second antenna, and a switch, disposed between the first capacitor and the second capacitor, to be opened or closed based on an operation mode of the antenna unit. The second antenna and the second capacitor form a closed loop which is coupled with the first antenna when the switch is opened.

According to a preferred embodiment of the present disclosure, the first antenna may be disposed at an outer portion of the circuit board, and the second antenna may be disposed inside of the first antenna of the circuit board.

In an embodiment of the present disclosure, the circuit board may be made from a flexible material.

In an embodiment of the present disclosure, the first antenna may be a wireless power transmission antenna of the magnetic resonance manner, and the second antenna may be a wireless power transmission antenna of the magnetic induction manner.

In an embodiment of the present disclosure, when the operation mode of the antenna unit is a wireless power transmission mode of the magnetic resonance manner, the switch may be opened.

In an embodiment of the present disclosure, the switch may be opened when a performance of the wireless power transmission through the first antenna is equal to or less than a reference value.

In an embodiment of the present disclosure, the performance of wireless power transmission may be a strength of the wireless power transmission or reception.

In an embodiment of the present disclosure, the switch may be closed when an operation mode of the antenna unit is the wireless power transmission mode of the magnetic induction manner.

In an embodiment of the present disclosure, the combo antenna module may further include a shielding unit disposed on a surface of the antenna unit to shield a magnetic field.

To accomplish the above and objects of the present disclosure, there is provided a combo antenna module that includes an antenna unit and a plurality of switching units. The antenna unit includes a circuit board, and a plurality of antennas having different operating frequencies from each other. The plurality of switching units include a first capacitor and a second capacitor which are connected in parallel to any one of the plurality of antennas, and a switch, disposed between the first capacitor and the second capacitor, to be opened or closed based on an operation mode of the antenna unit. When the switch is opened, the any one antenna and the second capacitor form a closed loop which is coupled with another antenna.

In an embodiment of the present disclosure, the antenna unit includes a first antenna disposed at an outermost portion of the circuit board; a second antenna disposed on a center area of the circuit board; and at least one a third antenna disposed between the first antenna and the second antenna.

In an embodiment of the present disclosure, an operating frequency of the second antenna may be lower than that of the first antenna and higher than that of the third antenna.

In an embodiment of the present disclosure, the first antenna may include any one of a wireless power transmission antenna of the magnetic resonance manner and a NFC antenna, the second antenna may be a wireless power transmission antenna of magnetic induction manner, and the third antenna may be a MST antenna.

In an embodiment of the present disclosure, when the antenna unit is in an operation mode in which the first antenna is used, at least one switching unit of the plurality of switching units may be opened.

In addition, when a performance of wireless power transmission or wireless communication through the first antenna is equal to or lower than a reference value, at least one of the plurality of switching units may be opened.

In an embodiment of the present disclosure, when the antenna unit is in an operation mode in which the first antenna is not used, all of the plurality of switching units may be closed.

To accomplish the above and objects of the present disclosure, there is provided a portable electronic device that includes a combo antenna module, a plurality of wireless module coupled with the plurality of antennas, respectively and a mode determination unit for determining which module of the plurality of wireless modules is operating and for controlling switching of the combo antenna module.

According to a preferred embodiment of the present disclosure, any one of the plurality of wireless modules may transmit or receive power wirelessly.

In an embodiment of the present disclosure, any one of the plurality of wireless modules may communicate wirelessly.

To accomplish the above and other objects of the present disclosure, there is provided a portable electronic device that includes a combo antenna module, a plurality of switching units, a plurality of wireless module, and a mode determination unit. The combo antenna unit includes an antenna unit having a circuit board, and a plurality of antennas having different operating frequencies from each other, and a shielding unit, disposed on a surface of the antenna unit, for shielding a magnetic field. The plurality of switching units include a first capacitor and a second capacitor which are connected in parallel to any one of the plurality of antennas, and a switch, disposed between the first capacitor and the second capacitor, to be opened or closed based on an operation mode of the antenna unit, wherein when the switch is opened, the any one antenna and the second capacitor form a closed loop which is coupled with another antenna. The plurality of wireless module is coupled with a plurality of antennas. The mode determination unit for determining which module of the plurality of wireless modules is operating and for controlling switching of the combo antenna module.

According to the present disclosure, by forming a closed loop using an antenna of other mode through antenna switching based on the operation mode of the antenna unit, a separate resonance circuit is additionally formed and coupled thereto, thereby improving the range, efficiency and performance of the wireless power transmission or wireless communication.

Further, by forming a closed loop so as to coupling an antenna using a low frequency with an antenna using a high frequency, it is possible to improve the range, the efficiency and the performance of the wireless power transmission or wireless communication without separately providing an additional internal pattern. Therefore, miniaturization of the combo antenna module having a plurality of antennas can be achieved.

Further, by applying the combo antenna module to the portable electronic device, it is possible improve the range, the efficiency and the performance of the wireless power transmission or wireless communication by switching based

DETAILED DESCRIPTION OF THE EMBODIMENTS

Figure 1:
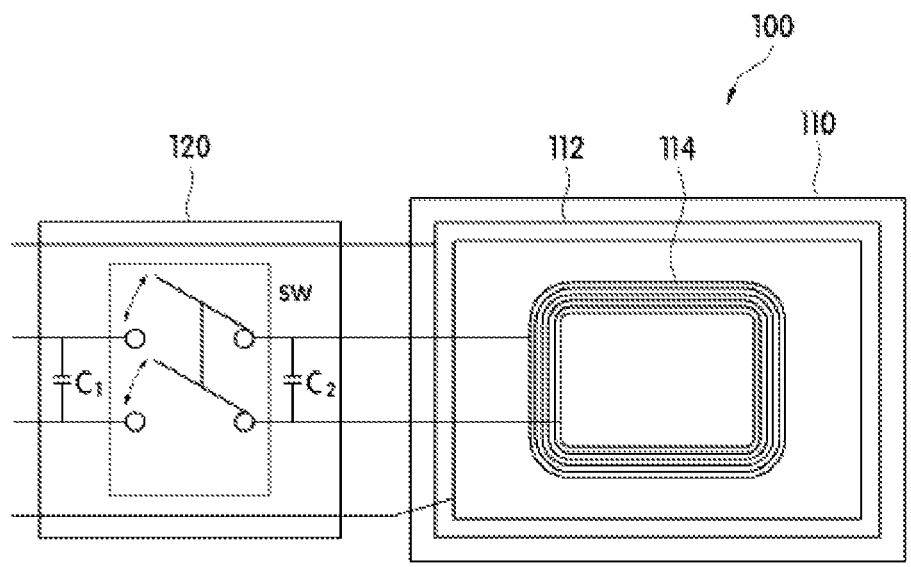
FIG. 1 is a schematic view of a combo antenna module according to an exemplary embodiment of the present disclosure.

Exemplary embodiments of the present disclosure will be described in details to the accompanying drawings, which will be apparent to one of ordinary skill in the art that the present disclosure may be practiced. The present disclosure may be embodied in many different forms and is not limited to the embodiments described herein. In the drawings, well-known methods, procedures, components, circuits and networks have not been described in detail so as to not to unnecessarily obscure aspects of the embodiments, and the same reference numerals are assigned to the same or similar components throughout the specification.

As shown in FIG. 1, a combo antenna module 100 includes an antenna unit 110 and a switching unit 120, according to an exemplary embodiment of the present disclosure.

Figure 6:
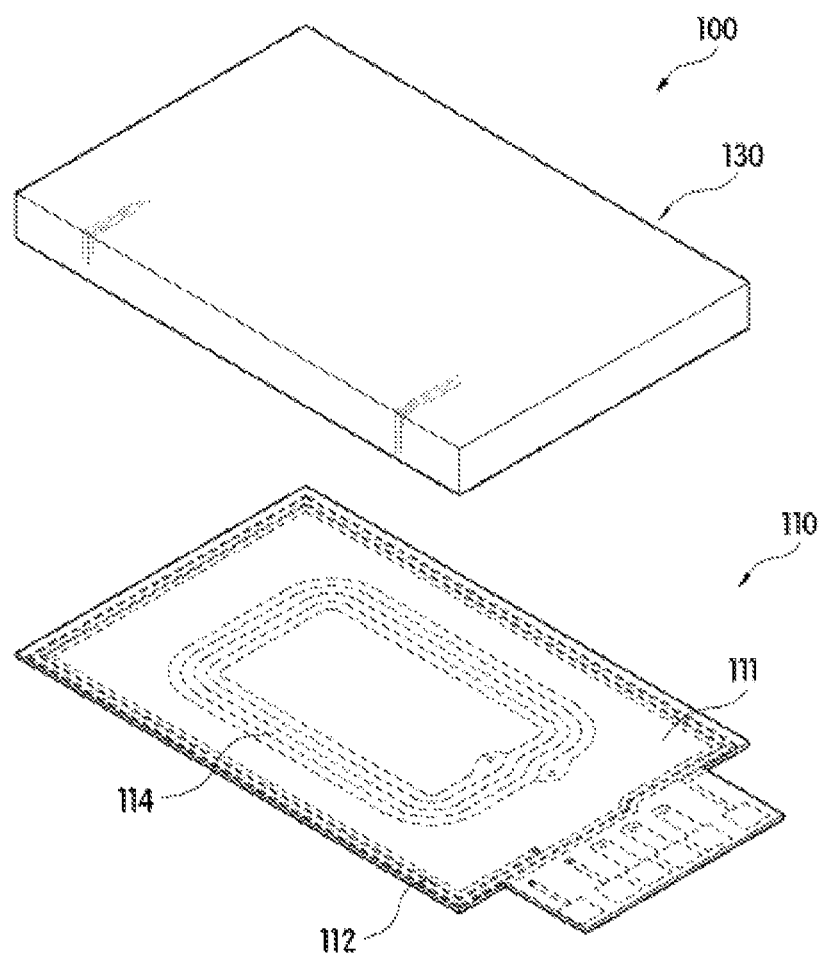
FIG. 6 is a perspective view schematically showing the combo antenna module according to an exemplary embodiment of the present disclosure.

The antenna unit 110 may be to receive a wireless signal from a portable electronic device such as a mobile phone, a PDA, a PMP, a tablet, a multimedia device, and the like. The antenna unit 110 may include a plurality of antennas that perform different roles, and in particular, a plurality of antennas for wireless power transmission. As shown in FIGS. 1 and 6, the antenna unit 110 may include a circuit board 111, a first antenna 112 and a second antenna 114.

The circuit board 111 may be a substrate having at least one antenna or a circuit unit formed optionally on a upper surface thereof. The circuit board 111 may be made from a material having a heat resistance, a pressure resistance and flexibility. Considering the physical properties of such a material, a thermosetting polymer film such as a film made from polyimide (PI), polyethylene terephthalate (PET), or the like may be used as the circuit board 111. In particular, the PI film can withstand a high temperature of 400° C. or higher and a low temperature of −269° C., this is, has super heat resistance and super cold resistance. In addition, the PI film is thin and flexible, and has a strong chemical resistance and an abrasion resistance. For these reasons, the PI film may be widely used to provide a stable performance in a severe environment.

In addition, the circuit unit (not shown) or a connection terminal for electrical connection with an electronic device may be provided on a side of the circuit board 111 by the number of antennas.

The first antenna 112 may be disposed on an outer side of the circuit board 111. The first antenna 112 may be a wireless power transmission antenna of a magnetic resonance manner, for example, may be an A4WP antenna.

The second antenna 114 may be a wireless power transmission antenna of a different manner from the first antenna 112. The second antenna 114 may be disposed inside the first antenna 112 of the circuit board 111 and may be a wireless power transmission antenna of a magnetic induction manner, for example, may be a WPC or a PMA antenna.

As shown in FIG. 6, the first antenna 112 and the second antenna 114 may be formed of a flat coil wound in a clockwise direction or counterclockwise direction. The wound flat coil may have a circular shape, an elliptical shape, a spiral shape, or a polygonal shape such as a quadrangular shape. Here, the first antenna 112 and the second antenna 114 may function as a reception coil (Rx coil) or a transmission coil (Tx coil) for wireless power transmission.

Although not illustrated here, when all of the plurality of antennas 112 and 114 are provided in the form of the flat coil, each of the connection terminals may be electrically connected to an external device without passing through the circuit board. In this case, the circuit board can be completely eliminated so that the production cost can be further reduced.

The switching unit 120 may be connected to the second antenna 114 of the antenna unit 110 and switch to form a closed loop coupling with the first antenna 112 in accordance with the operation mode of the antenna unit 110.

The switching unit 120 may include a first capacitor C1 and a second capacitor C2 which are connected in parallel to the second antenna 114 and a switch SW disposed between the first capacitor C1 and the second capacitor C2.

Here, the first capacitor C1 and the second capacitor C2 may be connected to each other or disconnected according to opening or closing of the switch SW. That is, when the switch SW is opened, the second antenna 114 and the second capacitor C2 may form a closed loop.

In this case, one side ends of the switch SW may be connected to both ends of the second antenna 114. In addition, the other ends of switch SW may be connected to a second wireless power module 16 coupled with the second antenna 114.

As a result, the first capacitor C1 may be directly connected to the second wireless power module 16, and the second capacitor C2 may be directly connected to the second antenna 114.

Here, when the switching unit 120 is closed, the first antenna 112 and the second antenna 114 may operate individually.

Figure 2:
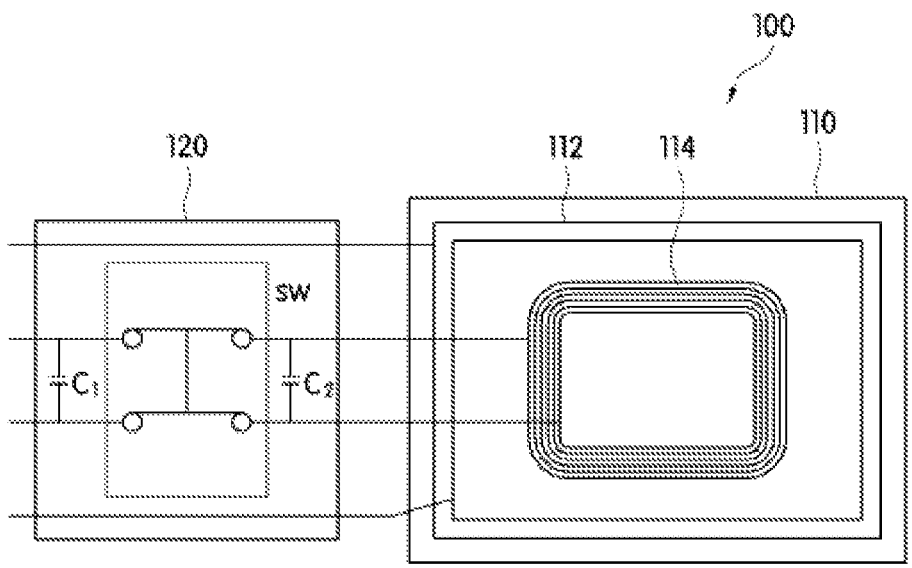
FIG. 2 is a block diagram schematically showing an example of an operating state of the combo antenna module according to an exemplary embodiment of the present disclosure.

For example, as shown in FIG. 2, the switch SW of the switching unit 120 may connect the first capacitor C1 with the second capacitor C2.

At this time, the wireless power transmission of the magnetic induction manner can be performed through the second antenna 114. In this case, the first antenna 112 does not operate because the first antenna 112 has a different frequency from that of the second antenna 114.

Figure 3:
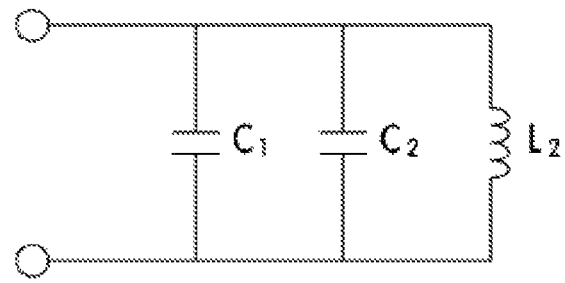
FIG. 3 is an equivalent circuit diagram of FIG. 2.

In this case, as shown in FIG. 3, the second antenna 114 may be connected with the two capacitors C1 and C2 of the switching unit 120 in parallel. The first operation frequency fant21 of the second antenna 114 may be calculated by the following Equation (1).

$$f_{ant21} = \frac{1}{2\pi\sqrt{L_2(C_1 + C_2)}}$$ [Equation 1]

Here, L2 is an inductance of the second antenna 114, and C1 and C2 are capacitances of the first capacitor C1 and the second capacitor C2 of the switching unit 120.

Figure 4:
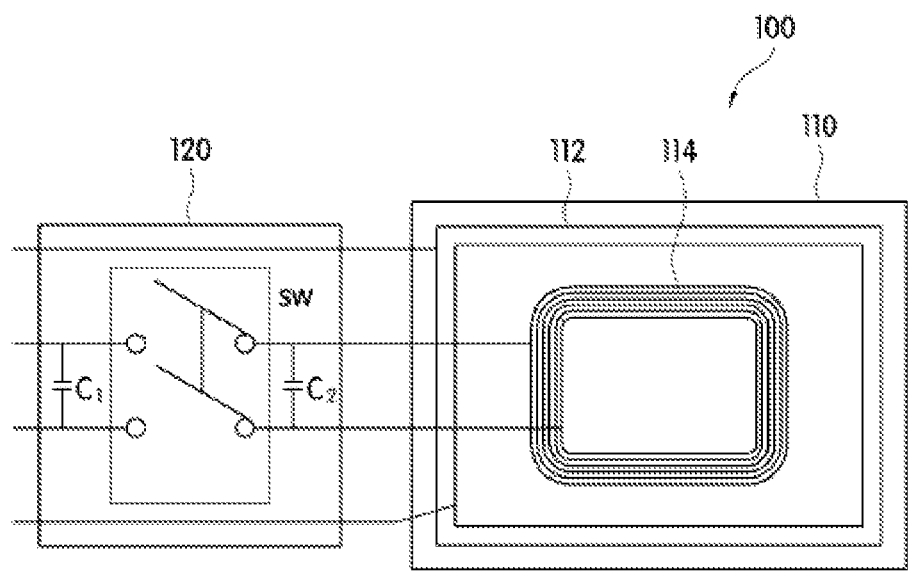
FIG. 4 is a diagram schematically showing another example of the operation state of the combo antenna module according to an exemplary embodiment of the present disclosure.

As shown in FIG. 4, when the switching unit 120 is opened, the second antenna 114 is disconnected from the second wireless power module 16 coupled with the second antenna 114, and the second antenna 114 and the second capacitor C2 may form a closed loop.

Figure 5:
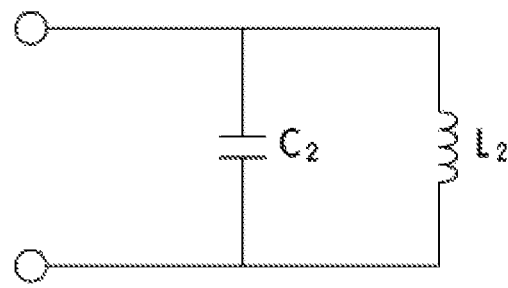
FIG. 5 is an equivalent circuit diagram of FIG. 4.

That is, as shown in FIG. 5, the second antenna 114 may form the closed loop with the second capacitor C2 of the switching unit 120 and constitute an independent resonance circuit. At this time, the resonance frequency formed by the resonance circuit, that is, the second operation frequency fant22 of the second antenna 114 can be calculated by the following equation (2).

$$f_{ant22} = \frac{1}{2\pi\sqrt{L_2 C_2}}$$ [Equation 2]

The independent resonance circuit can be coupled with the first antenna 112 if the resonance frequency fant22 coincides with the operating frequency of the first antenna 112. That is, when the wireless power is transmitted through the first antenna 112, for example, during the wireless power transmission of the magnetic resonance manner, the resonance circuit formed by the second antenna 114, separately from the first antenna 112, may also operate to transmit or receive the wireless power. At the same time, the resonance circuit formed by the second antenna 114 may be coupled with the first antenna 112.

As a result, by being coupled with the resonance circuit formed by the second antenna 114, the first antenna 112 can operate as if a separate antenna is added to the first antenna 112.

Here, by adjusting the capacitances of the first and second capacitors C1 and C2 and the inductance L2 of the antenna, the second antenna 114 may have the first operating frequency fant21 for performing the wireless power transmission of magnetic induction manner and the second operating frequency fant22 for coupling with the first antenna 112.

As such, together with the first antenna 112, the closed loop formed by the second antenna 114, can operate as one antenna. That is, the wireless power transmission of the magnetic resonance manner can be carried out through the first antenna 112 and the closed loop of the second antenna 114 coupled with the first antenna.

Thus, by forming the closed loop which couples with the first antenna 112, the second antenna 114 disposed inside the circuit board 111 can be used additionally for the wireless power transmission.

As a result, the range of the antenna used in the wireless power transmission of magnetic resonance manner may be extended to not only the outer portion of circuit board 111 but also the central portion of the circuit board 111. Thus, the efficient distance of the wireless power transmission by the magnetic resonance manner may increase and the range of the wireless power transmission may be widened. At the same time, since the wireless power transmission is performed over wider range, the efficiency of the wireless power transmission can be improved.

Further, by selectively using the second antenna 114 disposed inside the first antenna 112 by a switching operation, it is possible to improve the efficiency of the wireless power transmission without providing a separate antenna or pattern. Therefore, it is possible to downsize the combo antenna module 100 with respect to the same efficiency.

When the operation mode of the antenna unit 110 is the operation mode in which the first antenna 112 is used, for example, when the wireless power transmission is performed by the magnetic resonance manner, or by the first antenna 112, the second antenna 114 may form the closed loop to couple with the first antenna 112.

Alternatively, when the wireless power transmission performance through the first antenna 112 is equal to or lower than the reference value, the switching unit 120 may make the second antenna 114 to form the closed loop to couple with the first antenna 112. When the wireless power transmission is performed by the magnetic resonance manner, or by the first antenna 112, the switching unit 120 may not perform the switching operation to form the closed loop unconditionally. The switching operation of the switching unit 120 may be selectively performed only in a specific case such as when the efficiency of the wireless power transmission is equal to or lower than the reference value during such operation. At this time, the performance of the wireless power transmission may be a strength of the wireless power transmission or reception.

When the operation mode of the antenna unit 110 is the operation mode in which the first antenna 112 is not used, for example, when the wireless power transmission is performed by the magnetic induction manner, or by the second antenna 114, the switch SW of the switching unit 120 may be closed.

In the present embodiment, the combo antenna module 100 may include the switching unit 120, but the present disclosure is not limited thereto. The switching unit 120 may be provided separately from the antenna unit 110. For example, when the combo antenna module 100 is applied to the portable electronic device, the switching unit 120 may be disposed on the main circuit board, separately from the antenna unit 110.

Meanwhile, as shown in FIG. 6, the combo antenna module 100 may further include a shielding unit 130 disposed on a side of the antenna unit 110 to shield a magnetic field.

The shielding unit 130 is formed of a plate-shaped member having a predetermined area, and the antenna unit 110 is fixed on a surface of the shield unit 130.

The shielding unit 130 may shield the magnetic field generated by the antenna unit 110 and increase the magnetic field condensing rate, thereby enhancing the performance of the antenna unit 110 operating in a predetermined frequency band.

That is, when wireless power is transmitted by the magnetic induction manner in a frequency band of 100 to 350 kHz, or when wireless power is transmitted by the magnetic resonance manner in a frequency of 6.78 MHz, the shielding unit 130 is to enhance the performance of the antenna unit 110 operating in the frequency band.

To this end, the shielding unit 130 may be made from the magnetic material so as to shield the magnetic field generated from the antenna unit 110.

At this time, when the antenna unit 110 operates at a frequency band of 100 to 350 kHz in a low frequency band, the shielding unit 130 may be made from the material having a permeability, for example, in the range of 300 to 3500 Wb/A.m. When the antenna unit 110 operates at the frequency of 6.78 MHz, the shielding unit 130 may be made from the material having the permeability, for example, in the range of 100 to 350 Wb/A.m.

For example, the shielding unit 130 may be made of a Mn—Zn ferrite sheet, a ribbon sheet of the amorphous alloy or the nanocrystalline alloy, a polymer sheet, or the like having a permeability of 2000 to 3500 Wb/A.m in a low frequency band of 100 to 350 kHz. The shielding unit 130 may be made of a Ni—Zn ferrite sheet, a ribbon sheet of the amorphous alloy or the nanocrystalline alloy, a polymer sheet or the like having a permeability of 300 to 1500 Wb/A.m in the low frequency band of 100 to 350 kHz.

In addition, the shielding unit 130 may be a Ni—Zn ferrite sheet, a ribbon sheet of the amorphous alloy or the nanocrystalline alloy, a polymer sheet, or the like having a permeability of 100 to 350 Wb/A.m at a frequency of 6.78 MHz.

Here, the amorphous alloy or the nanocrystalline alloy may be a Fe-based or a Co-based magnetic alloy. The amorphous alloy and the nanocrystalline alloy may include a three-element alloy or a five-element alloy. For example, the three-element alloy may include Fe, Si, and B, and the five-element alloy may include Fe, Si, B, Cu, and Nb.

Figure 7:
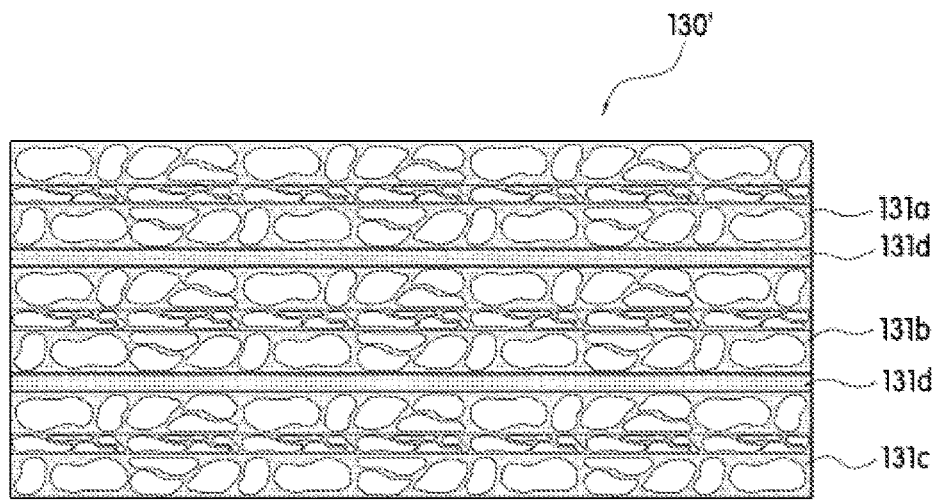
FIG. 7 is a cross-sectional view showing an example of a shielding unit of FIG. 6.

As shown in FIG. 7, the shielding unit 130' may be a multi-layer ribbon sheet which may be formed by stacking a plurality of ribbon sheets 131a, 131b, and 131c of the amorphous alloy or the nanocrystal alloy in two or more layers.

In addition, the shielding unit 130 may include a plurality of fine-pieces which are separated so as to suppress generation of eddy currents, and the plurality of fine-pieces may be entirely or partially insulated from the neighboring others.

The plurality of pieces may have a size of 1 μm to 3 mm, and each piece may have irregular shapes.

When the shielding sheet 130' is constructed by stacking the plurality of shielding sheets 131a, 131b, and 131c including the divided fine pieces, an adhesive layer 131d including a nonconductive component may be disposed between adjacent shielding sheets. Thereby, a part or the whole of the adhesive layer 131d between every pair of shielding sheets stacked on each other may permeate between the plurality of fine pieces constituting each sheet, and thus may insulate the neighboring fine pieces from each other. Here, the adhesive layer 131d may be formed of an adhesive agent, or may be provided in a form in which an adhesive agent may be applied to a side or both sides of a film type substrate.

At this time, the shielding unit 130 or 130' may be provided with a separate protective film (not shown) on at least one surface of the upper surface and the lower surface. When the shielding unit 130 or 130' is divided into fine pieces, by attaching the protective film (not shown) to the shielding unit 130 via an adhesive layer, the adhesive layer may permeate between the plurality of fine pieces and insulates the neighboring fine pieces from each other. Here, the adhesive layer 131d may be formed of an adhesive agent, or may be provided in a form in which an adhesive agent may be applied to a side or both sides of a film type substrate.

The combo antenna module 100 may be applied to a portable electronic device 10 according to an exemplary embodiment of the present disclosure.

Figure 8:
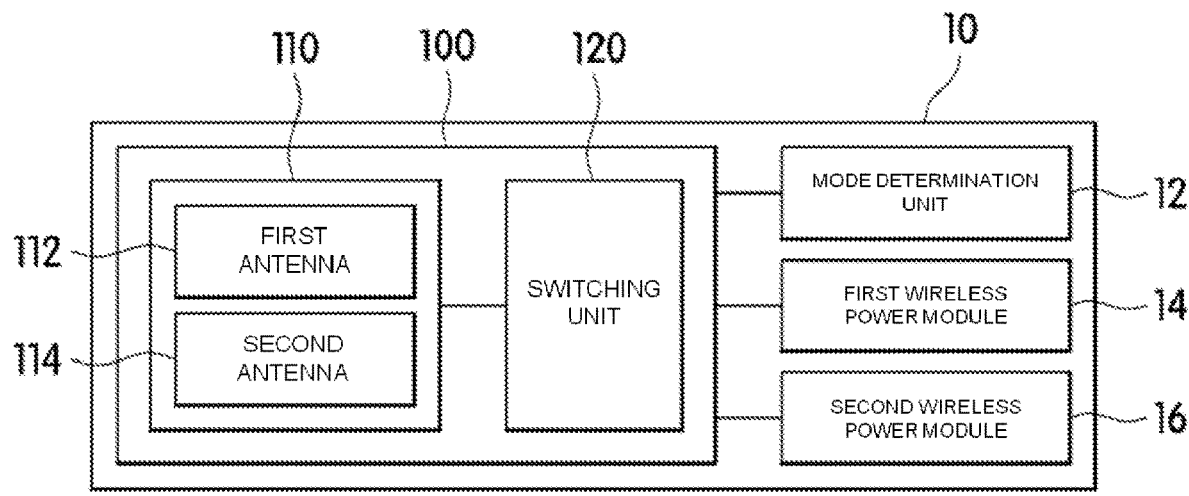
FIG. 8 is a schematic block diagram of a portable electronic device having a wireless power transmission function according to an exemplary embodiment of the present disclosure.

As shown in FIG. 8, the portable electronic device 10 may include the combo antenna module 100, a mode determination unit 12, a first wireless power module 14, and a second wireless power module 16.

The mode determining unit 12 may determine which one of the first wireless power module 14 and the second wireless power module 16 is operating and control the switching of the combo antenna module 100 based on the determination. For example, the mode determination unit 12 may determine the operation state based on the strength of the wireless power received through the each antenna of the combo antenna module 100.

Alternatively, the mode determination unit 12 may determine a condition for switching in a specific case only, rather than making the switching unit 120 to perform a switching operation unconditionally according to the operation mode of the first wireless power module 14 and the second wireless power module 16.

For example, during the wireless power transmission by the magnetic resonance manner through the first antenna 112 disposed on the outer portion of the circuit board 111, when the performance of wireless power transmission is equal to or less than the reference value, the portable electronic device 10 may control the switching operation of the switching unit 120 so that the second antenna 114 forms the closed loop to couple with the first antenna 112 to improve the efficiency.

At this time, the mode determination unit 12 may determine the specific condition for switching the switching unit 120. For example, the mode determination unit 12 may determine whether the wireless power transmission performance is equal to or less than the reference value based on the strength of wireless power transmission or reception.

The mode determination unit 12 may determine various conditions for switching the combo antenna module 100, and the embodiments of the present disclosure may not be particularly limited to the kind of the condition or the determination method.

The first wireless power module 14 may perform the wireless power transmission of the magnetic resonance manner in combination with the first antenna 112. The first wireless power module 14 may transmit or receive power wirelessly. That is, the first wireless power module 14 may include any one or both of a wireless power transmission module and a wireless power reception module.

The second wireless power module 16 may perform wireless power transmission of the magnetic induction manner in combination with the second antenna 114. The second wireless power module 16 may transmit or receive power wirelessly. That is, the second wireless power module 16 may include any one or both of the wireless power transmission module and the wireless power reception module.

Here, when the first wireless power module 14 and the second wireless power module 16 function as the wireless power transmission module, the portable electronic device may include an inverter (not shown) which converts a direct current (DC) power supplied from the power supply of the portable electronic device 10 to an alternating current (AC) power and supplies the AC power to the first antenna 112 and the second antenna 114.

Also, when the first wireless power module 14 and the second wireless power module 16 function as the wireless power receiving module, the portable electronic device may include a rectifier (not shown) for rectifying the wireless AC power received from the first antenna 112 and the second antenna 114 into a DC power and a DC-DC converter (not shown) for converting the rectified DC power into another DC power source being suitable for charging a battery of the portable electronic device 10 or an internal power source.

In addition, when the first wireless power module 14 and the second wireless power module 16 function as both the wireless power receiving module and the wireless power transmitting module, the portable electronic device may include the inverter (not shown), the rectifier, and the DC-DC converter.

As described above, since the combo antenna module 100 according to the embodiments of the present disclosure is provided in the portable electronic device 10, the wireless power transmission range and efficiency can be improved by the switching operation based on the operation mode. Therefore, convenience and satisfaction for the user of the portable electronic device 10 can be improved.

In an exemplary embodiment of the present disclosure, the combo antenna module 100 includes the switching unit 120 in the description above. However, the present disclosure is not limited thereto. The switching unit 120 may be provided separately from the antenna unit 110. For example, when the combo antenna module 100 is applied to the portable electronic device, the switching unit 120 may be disposed on a main circuit board of the portable electronic device, separately from the antenna unit 110.

In an exemplary embodiment of the present disclosure, the antenna unit 110 includes two antennas 112 and 114 for wireless power transmission. However, the present disclosure is not limited to this, and the antenna unit may further include a wireless communication antenna such as the NFC or the MST antenna.

Figure 9:
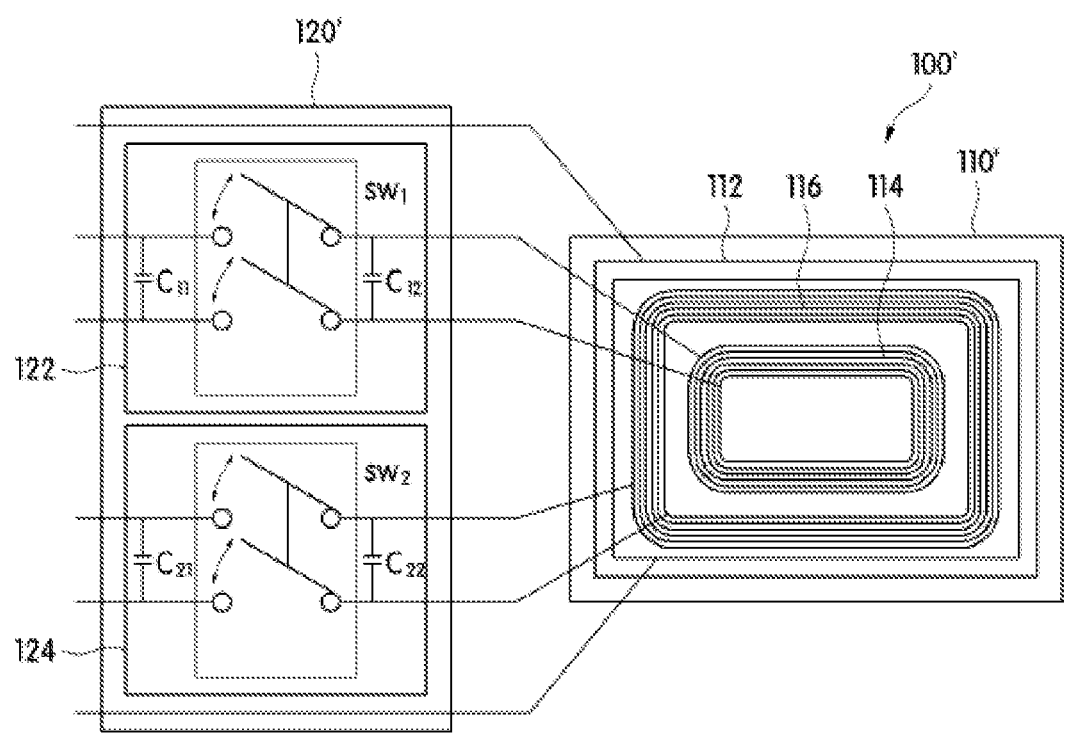
FIG. 9 is a diagram schematically showing the combo antenna module according to another exemplary embodiment of the present disclosure.
Figure 14:
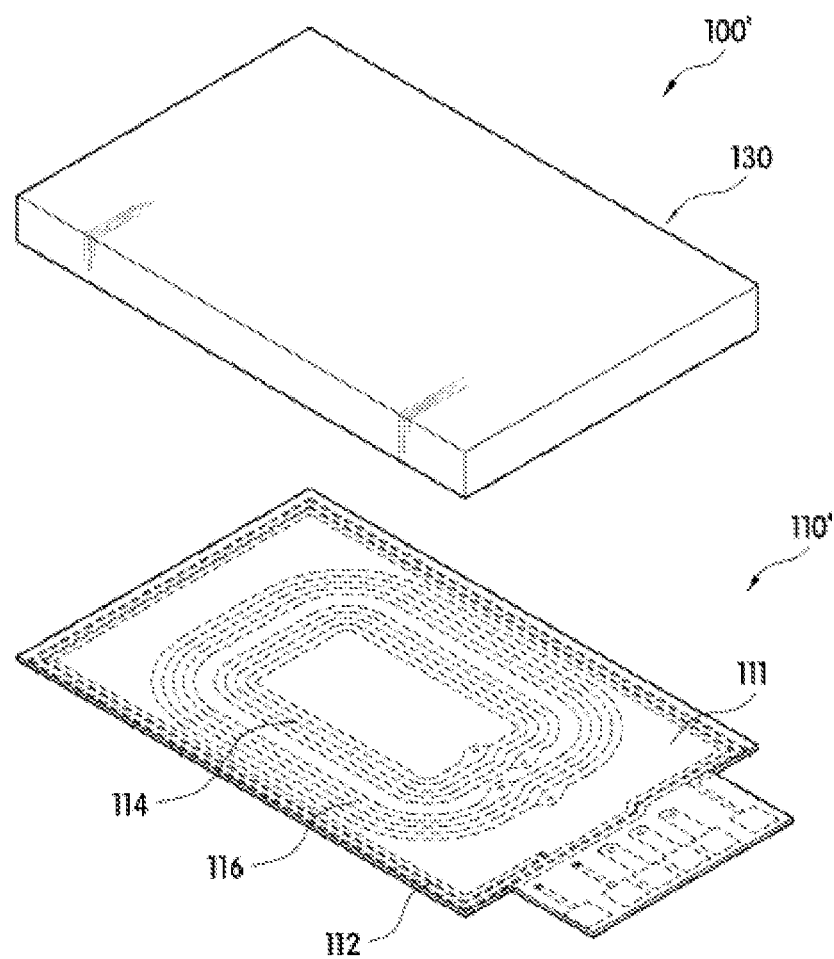
FIG. 14 is a perspective view schematically showing the combo antenna module according to another exemplary embodiment of the present disclosure.

As shown in FIGS. 9 and 14, the antenna unit 110' may include the circuit board 111, the first antenna 112, the second antenna 114 and the third antenna 116.

The first antenna 112 may be disposed at an outermost portion of the circuit board 111. The first antenna 112 may have an operating frequency band of more than several MHz.

At this time, the first antenna 112 may be a wireless power transmission antenna of the magnetic resonance manner using the frequency of 6.78 MHz, and for example, may be an A4WP antenna. Also, the first antenna 112 may be a communication antenna using the frequency of 13.56 MHz, and for example, may be an NFC antenna.

The second antenna 114 may be disposed on the inner side of the first antenna 112 of the circuit board 111, particularly on the central area of the circuit board 111. The second antenna 114 may have an operating frequency which is lower than that of the first antenna 112 and higher than that of the third antenna 116. For example, the second antenna 114 may have an operating frequency of several hundred kHz.

In this case, the second antenna 114 may be the wireless power transmission antenna of the magnetic induction manner using a frequency band of 100 to 350 kHz, and for example, may be the WPC or the PMA antenna. In addition, the second antenna 114 may be the communication antenna using a frequency band of 100 to 350 kHz, the wireless power reception antenna, or the wireless power transmission antenna.

The third antenna 116 may be disposed between the first antenna 112 and the second antenna 114 on the circuit board 111. The third antenna 116 may have an operating frequency which is lower than that of the first antenna 112. For example, the third antenna 116 may have an operating frequency band of 100 kHz or less.

At this time, the third antenna 116 may be the communication antenna using the frequency band of 100 kHz or less, and for example, may be the MST antenna. Also, the third antenna 116 may be the wireless power transmission antenna using the frequency band of 100 kHz or less.

Although the third antenna 116 is shown as one antenna disposed between the first antenna 112 and the second antenna 114, the present disclosure is not limited thereto. The third antenna 116 may be a plurality of antennas, disposed between the first antenna 112 disposed on the outermost area of the circuit board and the second antenna 114 disposed on the center area of the circuit board, and having different operating frequencies from each other.

As shown in FIG. 14, the first antenna 112, the second antenna 114, and the third antenna 116 may be formed of a flat coil wound in a clockwise direction or counterclockwise direction. The wound flat coil may have a circular shape, an elliptical shape, a spiral shape, or a polygonal shape such as a quadrangular shape. Here, the first antenna 112 and the second antenna 114 may function as a reception coil (Rx coil) or a transmission coil (Tx coil) for wireless power transmission.

Although not shown in the drawings, when all of the plurality of antennas 112 and 114 are provided in the form of the flat coil, each of the connection terminals may be electrically connected to an external device without passing through the circuit board. In this case, the circuit board may not be employed so that the production cost can be further reduced.

Here, the plurality of switching units 120' may be connected to any one of a plurality of antennas of the antenna unit 110' and switch to form the closed loop coupling with the other antenna based on the operation mode of the antenna unit 110'. Here, the number of the plurality of switching units 120' may be less than the number of antennas of the antenna unit 110' by at least one. That is, the plurality of switching units 120' may be connected to the remaining antennas among the plurality of antennas of the antenna unit 110', respectively, except for the first antenna 112 disposed at the outermost portion.

Hereinafter, the case where the number of antennas of the antenna unit 110' is three and the number of the switching units 120' is two, will be described. Here, the plurality of switching units 120' may include a first switching unit 122 and a second switching unit 124.

The first switching unit 122 may include a first capacitor C11 and a second capacitor C12 connected in parallel to any one of the antennas, for example, the second antenna 114, except for the first antenna 112 disposed at the outermost portion of the antenna unit 110', and a first switch SW1 disposed between the first capacitor C11 and the second capacitor C12.

Here, the first capacitor C11 and the second capacitor C12 may be connected or disconnected according to opening or closing of the first switch SW1. That is, when the first switch SW1 is opened, the second antenna 114 and the second capacitor C12 form the closed loop.

In this case, the one side ends of first switch SW1 may be connected to the both end of the second antenna 114. In addition, the other ends of first switch SW1 may the connected to the second wireless power module 16 coupled with the second antenna 114.

As a result, the first capacitor C11 may he directly connected to the second wireless power module 16, and the second capacitor C12 may he directly connected to the second antenna 114.

The second switching unit 124 may include a third capacitor C21 and a fourth capacitor C22 connected in parallel to any one of the antennas, for example, the third antenna 116 except for the first antenna 112 disposed at the outermost portion of the antenna unit 110', and a second switch SW2 disposed between the third capacitor C21 and the fourth capacitor C22.

Here, the third capacitor C21 and the fourth capacitor C22 may be connected or disconnected according to opening or closing of the second switch SW2. That is, when the second switch SW2 is opened, the third antenna 116 and the fourth capacitor C22 may form a closed loop.

At this time, the one side ends of second switch SW2 may be connected to both end of the third antenna 116. In addition, the other ends of second switch SW2 may be connected to the third wireless power module 18 coupled with the third antenna 116.

As a result, the third capacitor C21 may be directly connected to the third wireless power module 18, and the fourth capacitor C22 may be directly connected to the third antenna 116.

Here, when the pluralities of switching units 120' are all closed, the first antenna 112, the second antenna 114, and the third antenna may operate individually.

Figure 10:
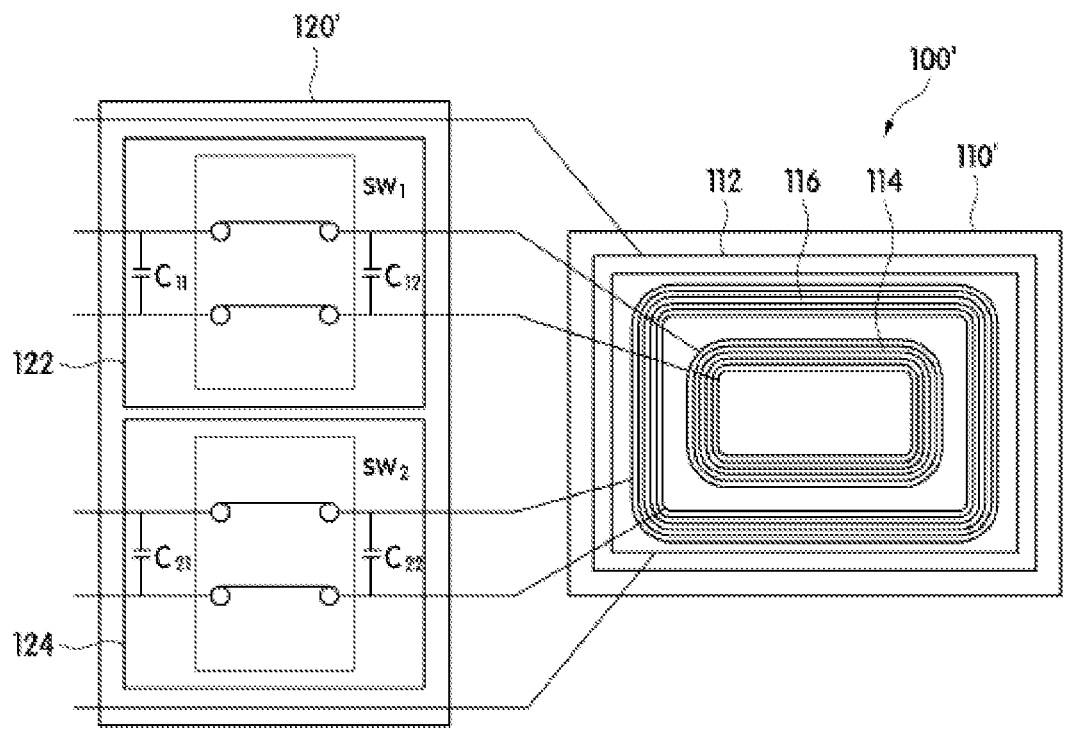
FIG. 10 is a diagram schematically showing an example of the operating state of the combo antenna module according to another exemplary embodiment of the present disclosure.
Figure 11:
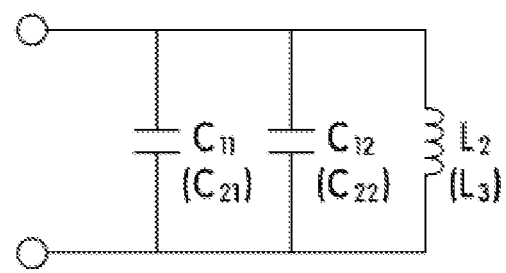
FIG. 11 is an equivalent circuit diagram of FIG. 10.

For example, as shown in FIG. 10, the first switch SW1 of the first switching unit 122 may connect the first capacitor C11 with the second capacitor C12. The second switch SW2 of the second switching unit 124 may connect the third capacitor C21 with the fourth capacitor C22.

At this time, the wireless power transmission and the wireless communication can be performed through any one of the second antenna 114 or the third antenna 116. For example, the wireless power transmission by the magnetic induction manner or the MST communication may be performed. In this case, the first antenna 112 does not operate because the first antenna 112 has a different frequency from that of the second antenna 114 or the third antenna 116.

In this case, as shown in FIG. 10, the second antenna 114 may be connected in parallel with the two capacitors C11, and C12 which are connected to the first switching unit 122, and the third antenna 116 may be connected in parallel with and the two capacitors C21, and C22 which are connected to the second switching unit 124. At this time, the first operation frequency fant21 of the second antenna 114 and the first operation frequency fant31 of the third antenna 116 may be calculated by the following Equation (3).

$$f_{ant21} = \frac{1}{2\pi\sqrt{L_2(C_{11}+C_{12})}}, f_{ant31} = \frac{1}{2\pi\sqrt{L_3(C_{21}+C_{22})}} \quad \text{[Equation 3]}$$

Here, L2 and L3 are the inductances of the second antenna 114 and the third antenna 116, respectively. C11 and C12 are the capacitances of the first capacitor C11 and the second capacitor C11 of the first switching unit 122, respectively. C21 and C22 are the capacitances of the third capacitor C21 and the fourth capacitor C22 of the second switching unit 124, respectively.

Figure 12:
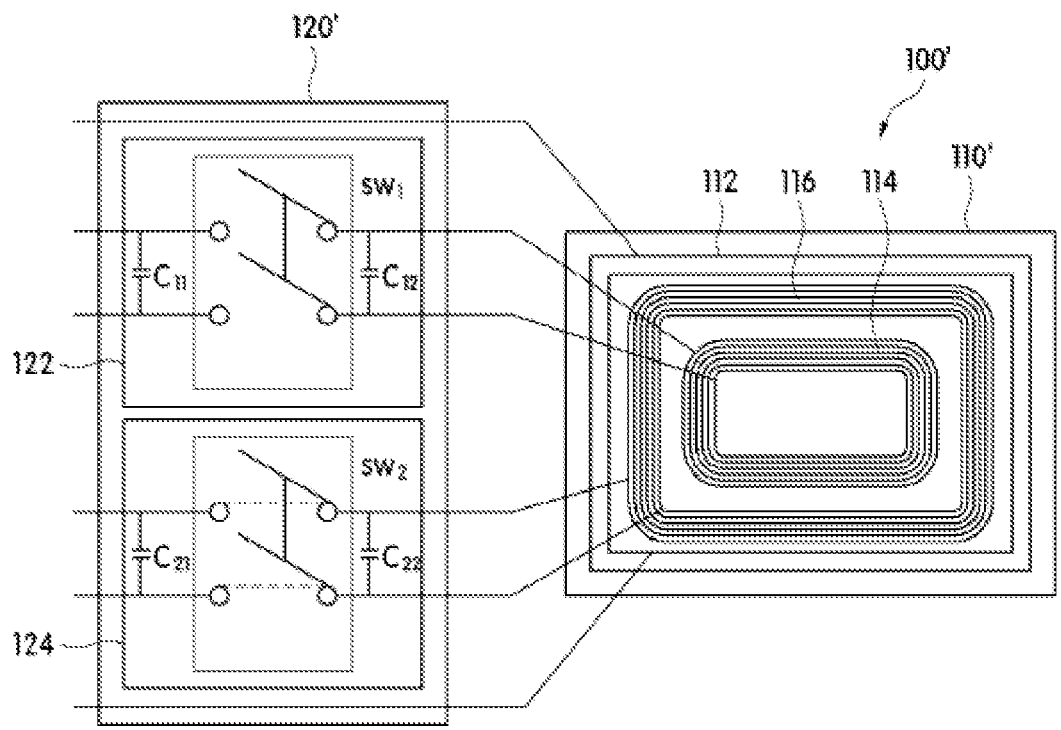
FIG. 12 is a diagram schematically showing another example of the operation state of the combo antenna module according to another embodiment of the present disclosure.

As shown in FIG. 12, when at least one of the plurality of switching units 120' is opened, at least one of the second antenna 114 and the third antenna 116 may be disconnected from at least one of the second wireless power module 16 and the third wireless power module 18 coupled with the second antenna 114 and the third antenna 116, respectively. The relevant antenna and at least one of the second and fourth capacitors C12 and C22 may form the closed loop.

Figure 13:
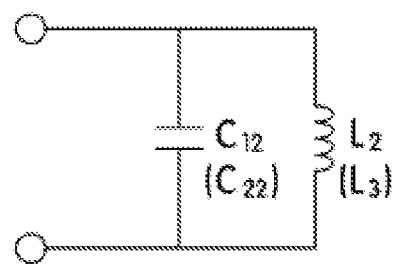
FIG. 13 is an equivalent circuit diagram of FIG. 12.

As shown in FIG. 13, each of the second antenna 114 and the third antenna 116 may form the closed loop with each of the capacitor C12 and C22 of the first switching unit 122 and the second switching unit 124, and the closed loop may function as an independent resonance circuit. The resonance frequency of each of the resonance circuits, that is, the second operation frequency fant22 of the second antenna 114 and the second operation frequency fant32 of the third antenna 116 may be expressed by the following equation (4).

$$f_{ant22} = \frac{1}{2\pi\sqrt{L_2 C_{12}}}, f_{ant32} = \frac{1}{2\pi\sqrt{L_3 C_{22}}} \quad \text{[Equation 4]}$$

These independent resonance circuits may be coupled to the first antenna 112 if each resonant frequency fant22 or fant32 coincides with the operating frequency of the first antenna 112. Thus, during the wireless power transmission or the wireless communication through the first antenna 112, for example, during the wireless power transmission of the magnetic resonance manner or the NFC communication, the resonance circuit formed by at least one of the second antenna 114 and the third antenna 116 may perform the wireless power transmission/reception or the wireless communication separately from the first antenna 112. At the same time, the resonance circuit formed by at least one of the second antenna 114 and the third antenna 116 may be coupled with the first antenna 112.

As a result, by being coupling with the resonance circuit formed by at least one of the second antenna 114 and the third antenna 116, the first antenna 112 may operate as if a separate antenna is added.

By adjusting the capacitances of the capacitors C11, C21, C12 and C22, and the inductances L2 and L3 of the antennas, the second antenna 114 and the third antenna 116 may have the first operating frequencies fant21 and fant31 for performing their own functions, respectively, and the second operating frequencies fant22 and fant32 for being coupled with another antenna, for example, the first antenna 112.

In this manner, together with the first antenna 112, the closed loop formed by at least one of the second antenna 114 and the third antenna 116 may operate as one antenna. That is, in this case, the wireless power transmission may be performed by a magnetic resonance manner or the NFC communication through the first antenna 112 and the closed loop coupled with the first antenna 112 may be performed.

Accordingly, as at least one of the second antenna 114 and the third antenna 116 forms the closed loop to be coupled with the first antenna 112, at least one of the second antenna 114 and the third antenna 116 disposed inside of the circuit board 111 may be additionally used as an antenna.

As a result, the range of the antenna used for the wireless power transmission of magnetic resonance manner can be extended to not only the outer portion of circuit board 111 but also the central portion of the circuit board 111. Thus, the distance the wireless signal can efficiently reach may increase, and thus the coverage of the wireless power transmission or the wireless communication can be enlarged. At the same time, since the wireless power transmission or wireless communication can be performed over wider range, the efficiency of the wireless power transmission or the performance of the wireless communication can be enhanced.

In addition, by selectively using at least one of the second antenna 114 and the third antenna 116 disposed inside the first antenna 112 by switching, it is possible to improve the wireless power transmission efficiency or the performance of the wireless communication without providing a separate antenna or a pattern. Accordingly, the combo antenna module 100' can be miniaturized with respect to the same efficiency/performance.

As such, when the operation mode of the antenna unit 110' is the operation mode using the first antenna 112, for example, when wireless power transmission is performed by the magnetic resonance manner, when the NFC communication is performed, or when wireless power transmission or wireless communication is performed through the first antenna 112, the plurality of switching unit 120' may make at least one of the second antenna 114 and the third antenna 116 to form the closed loop coupled with the first antenna 112.

Alternatively, when the wireless power transmission performance through the first antenna 112 is equal to or lower than the reference value, at least one of the second antenna 114 and the third antenna 116 may form the closed loop to couple with the first antenna 112. That is, when the wireless power transmission by the magnetic resonance manner or the NFC communication is performed through the first antenna 112, the switching unit 120' may not perform the switching operation unconditionally, but perform the switching operation selectively only in a specific case such as when the efficiency/performance is equal to or lower than the reference value during such the wireless power transmission or communication operation. At this time, the wireless performance may be the strength of wireless transmission or reception, for example, the strength of wireless communication or the strength of the wireless power transmission or reception.

When the operation mode of the antenna unit 110' is the operation mode in which the first antenna 112 is not used, for example, when the wireless power transmission in the magnetic resonance manner, or the MST communication is performed is performed through either the second antenna 114 or the third antenna 116, all switches SW1 and SW2 of the plurality of switching units 120' may be closed.

In this case, even though the case that at least one of the second antenna 114 and the third antenna 116 may form the closed loop to be coupled with the first antenna 112, the present disclosure is not limited thereto. At least one other antenna may form the closed loop to be coupled with any one of the antennas.

Let's consider a case that wireless power is transmitted by the magnetic resonance manner in a frequency band of 100 to 350 kHz, a case that wireless power is transmitted by the magnetic resonance manner at a frequency of 6.78 MHz, a case that the MST communication is performed in the frequency band of 100 kHz or less, or a case that the NFC communication is performed at the frequency of 13.56 MHz. In these case, the shielding unit 130 is to enhance the performance of the antenna unit 110' operating in the relevant frequency or frequency band.

Here, the shielding unit 130 is not specifically described, but the same technical features as those described with reference to FIGS. 6 and 7 can be applied.

Such the combo antenna module 100' according to another embodiment of the present disclosure can be applied to the portable electronic device 10'.

Figure 15:
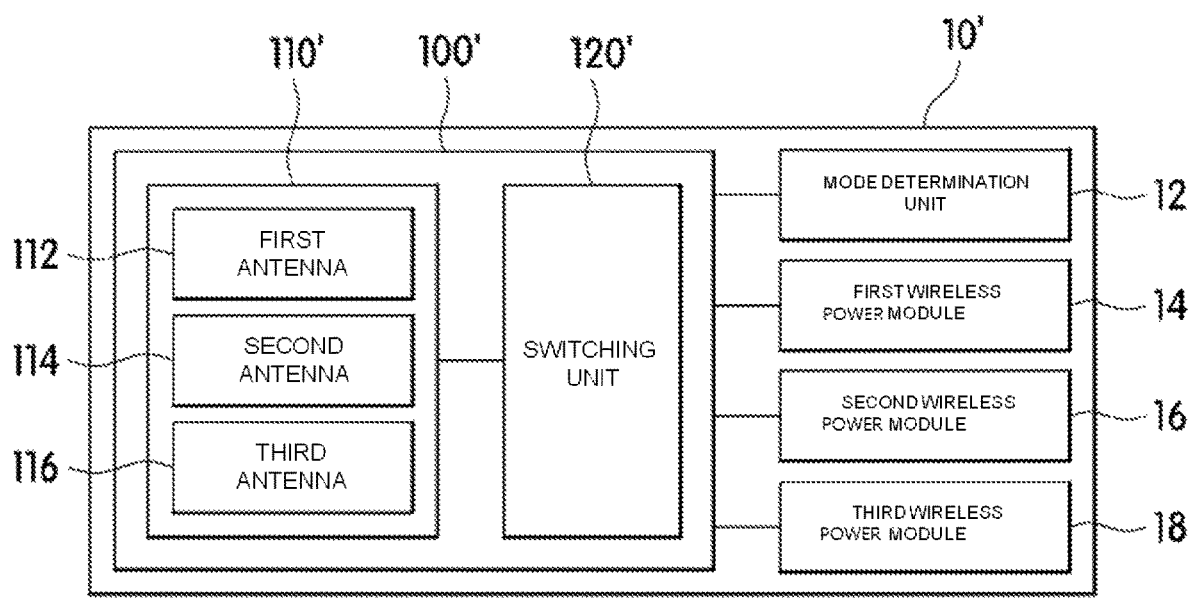
FIG. 15 is a schematic block diagram of the portable electronic device according to another exemplary embodiment of the present disclosure.

As shown in FIG. 15, the portable electronic device 10' according to another embodiment of the present disclosure may include the combo antenna module 100', the mode determination unit 12, a plurality of wireless power modules 14, 16 and 18.

The mode determination unit 12 determines which module of the plurality of wireless power modules 14, 16, and 18 is operating and controls the switching for the combo antenna module 100'. At this time, the mode determination unit 12 may determine the operation state based on the strength of wireless power received through each antenna of the combo antenna module 100'.

Alternatively, the mode determination unit 12 may determine the condition in which the switching unit 120' does not perform the switching operation unconditionally according to the operation mode of the plurality of wireless power modules 14, 16, and 18 but does perform the switching operation only in a specific case.

For example, let's consider a case that the wireless power transmission efficiency is equal to or less than the reference value when the wireless power is transmitted by a magnetic resonance manner through the first antenna 112 disposed at the outermost portion of the circuit board 111, or another case that wireless communication performance is equal to or less than the reference value during NFC communication. In order to enhance the power transmission efficiency or the communication performance, the switching unit 120' may perform the switching operation so as to make at least one of the second antenna 114 and the third antenna 116 to form the closed loop to be coupled with the first antenna 112.

At this time, the mode determination unit 12 may determine the specific condition for switching the switching unit 120'. For example, the mode determination 12 may determine whether the wireless transmission performance is below the reference value based on the strength of wireless transmission or reception signal. That is, the mode determination unit 12 may determine the wireless transmission performance according to the strength of the transmission or reception signal of the wireless communication, or the strength of the wireless power transmission or reception.

The mode determination unit 12 may determine various conditions for switching the combo antenna module 100', and the embodiment of the present disclosure is not particularly limited to the kind or method of the determination condition.

The plurality of wireless power modules may include the first wireless power module 14, the second wireless power module 16, and the third wireless power module 18.

The first wireless power module 14 may perform the wireless power transmission by the magnetic resonance manner or performs NFC communication in combination with the first antenna 112. That is, the first wireless power module 14 can transmit or receive power wirelessly. For example, the first wireless power module 14 may include one or both of the wireless power transmission module and the wireless power reception module. In addition, the first wireless power module 14 may communicate, receive, or transmit wirelessly, and may include, any one or both of the wireless receiving module and the wireless transmitting module.

The second wireless power module 16 may perform wireless power transmission by the magnetic induction manner or wireless communication in combination with the second antenna 114. That is, the second wireless power module 16 may transmit or receive power wirelessly. For example, the second wireless power module 16 may include one or both of the wireless power transmission module and the wireless power reception module. In addition, the first wireless power module 14 may communicate, receive, or transmit wirelessly. For example, the first wireless power module 14 may include any one or both of a wireless receiving module and a wireless transmitting module.

The third wireless power module 18 may perform the MST communication or the wireless power transmission in combination with the third antenna 116. That is, the third wireless power module 18 may communicate, receive, or transmit wirelessly, and may include any one or all of the wireless receiving module and the wireless transmitting module. In addition, the third wireless power module 18 may transmit or receive power wirelessly. For example, the third wireless power module 18 may include one or both of the wireless power transmission module and the wireless power reception module Here, although the first wireless power module 14, the second wireless power module 16, and the third wireless power module 18 are not specifically described, the same technical features as described with reference to FIG. 8 may be applied also.

As described above, the combo antenna module 100' according to the embodiment of the present disclosure may be applied to the portable electronic device 10'. Accordingly, the range, efficiency and performance of wireless power transmission or wireless communication can be improved. The convenience and satisfaction for the user of the portable electronic device 10' can be enhanced.

While the present disclosure has been particularly shown and described with reference to exemplary embodiments thereof, it is to be understood that the disclosure is not limited to the disclosed exemplary embodiments, It will be understood by those skilled in the art that various changes in form and details may be made therein without departing from the spirit and scope of the disclosure as defined by the appended claims.

What is claimed is:

1. A combo antenna module comprising:
an antenna unit including a circuit board, a first antenna for wireless power transmission, and a second antenna for wireless power transmission of which manner is different from that of the first antenna; and
a switching unit including a first capacitor and a second capacitor connected in parallel to the second antenna and a switch disposed between the first capacitor and the second capacitor to be opened or closed based on an operation mode of the antenna unit,
wherein when the switch is opened, the second antenna and the second capacitor form a closed loop which is coupled with the first antenna,
wherein the first antenna is disposed at an outer portion of the circuit board and a wireless power transmission antenna of a magnetic resonance manner, and the second antenna is disposed inside the first antenna of the circuit board and a wireless power transmission antenna of a magnetic induction manner,
wherein when the antenna unit is in an operation mode in which the first antenna is used and a performance of wireless power transmission through the first antenna is equal to or less than a reference value, the switch is opened.

2. The combo antenna module of claim 1, wherein the circuit board is made from a flexible material.

3. The combo antenna module of claim 1, wherein the performance of wireless power transmission is a strength of the wireless power transmission or reception.

4. The combo antenna module of claim 1, wherein the switch is closed when an operation mode of the antenna unit is the wireless power transmission mode of the magnetic induction manner.

5. The combo antenna module of claim 1, wherein the combo antenna module further includes a shielding unit disposed on a surface of the antenna unit to shield the magnetic field.

6. A combo antenna module comprising:
an antenna unit including a circuit board, and a plurality of antennas having different operating frequencies from each other; and
a plurality of switching units including a first capacitor and a second capacitor which are connected in parallel to any one of the plurality of antennas, and a switch, disposed between the first capacitor and the second capacitor, to be opened or closed based on an operation mode of the antenna unit,
wherein when the switch is opened, the any one antenna and the second capacitor form a closed loop which is coupled with another antenna,
wherein the antenna unit includes a first antenna disposed at an outermost portion of the circuit board; a second antenna disposed on a center area of the circuit board; and at least one third antenna disposed between the first antenna and the second antenna,
wherein the first antenna includes any one of a wireless power transmission antenna of the magnetic resonance manner and a near field communication (NFC) antenna, and wherein the second antenna is a wireless power transmission antenna of magnetic induction manner, and the third antenna is a magnetic secure transmission (MST) antenna,
wherein when the antenna unit is in an operation mode in which the first antenna is used and a performance of wireless power or wireless power transmission or wireless communication through the first antenna is equal to or lower than a reference value, at least one switching unit of the plurality of switching units is opened.

7. The combo antenna module of claim 6, wherein the operating frequency of the second antenna is lower than that of the first antenna and higher than that of the third antenna.

8. The combo antenna module of claim 6, wherein when the antenna unit is in an operation mode in which the first antenna is not used, the plurality of switching units is all closed.

9. A portable electronic device comprising:
a combo antenna module including an antenna unit having a circuit board, a first antenna for wireless power transmission, and a second antenna for wireless power transmission of which manner is different from that of the first antenna; and a switching unit having a first capacitor and a second capacitor connected in parallel to the second antenna and a switch disposed between the first capacitor and the second capacitor to be opened or closed based on an operation mode of the antenna unit, wherein when the switch is opened, the second antenna and the second capacitor form a close loop which is coupled with the first antenna;

a plurality of wireless power modules coupled with the first and second antennas, respectively; and a mode determination unit for determining which module of the plurality of wireless power modules is operating and for controlling switching of the combo antenna module, wherein the first antenna disposed at an outermost portion of the circuit board; the antenna disposed on a center area of the circuit board: and at least one third antenna disposed between the first antenna and the second antenna, wherein the first antenna includes any one of a wireless power transmission antenna of the magnetic resonance manner and a near field communication (NFC) antenna, and wherein the second antenna is a wireless power transmission antenna of magnetic induction manner, and the third antenna is a magnetic secure transmission (MST) antenna, wherein when the antenna unit is in an operation mode in which the first antenna is used and a performance of wireless power or wireless power transmission or wireless communication through the first antenna is equal to or lower than a reference value, at least one switching unit of the plurality of switching units is opened.

10. The portable electronic device of claim 9, wherein any one of the plurality of wireless power modules transmits or receive power wirelessly.

11. The portable electronic device of claim 9, wherein any one of the plurality of wireless power modules communicates wirelessly.

12. A portable electronic device comprising:

a combo antenna module including an antenna unit having a circuit board and a plurality of antennas having different operating frequencies from each other, and a shielding unit, disposed on a surface of the antenna unit, for shielding a magnetic field;

a plurality of switching units including a first capacitor arid a second capacitor which are connected in parallel to any one of the plurality of antennas, and a switch, disposed between the first capacitor and the second capacitor, to be opened or closed based on an operation mode of the antenna unit, wherein when the switch is opened, any one antenna and the second capacitor form a closed loop which is coupled with another antenna;

and a mode determination unit for determining which module of the plurality of wireless modules is operating and for controlling switching of the combo antenna module, wherein the antenna unit includes a first antenna disposed at an outermost portion of the circuit board; a second antenna disposed on a center area of the circuit board; and at least one third antenna disposed between the first antenna and the second antenna, wherein the first antenna includes any one of a wireless power transmission antenna of the magnetic resonance manner and a near field communication (NFC) antenna, and wherein the second antenna is a wireless power transmission antenna of magnetic induction manner, and the third antenna is a magnetic secure transmission (MST) antenna, wherein when the antenna unit is in an operation mode in which the first antenna is used and a performance of wireless power or wireless power transmission or wireless communication through the first antenna is equal to or lower than a reference value, at least one switching unit of the plurality of switching units is opened.

\* \* \* \* \*